US007045859B2

United States Patent
Amali et al.

(10) Patent No.: US 7,045,859 B2
(45) Date of Patent: May 16, 2006

(54) TRENCH FET WITH SELF ALIGNED SOURCE AND CONTACT

(75) Inventors: Adam I. Amali, Hawthorne, CA (US); Naresh Thapar, Los Angeles, CA (US)

(73) Assignee: International Rectifier Corporation, El Segundo, CA (US)

( * ) Notice: Subject to any disclaimer, the term of this patent is extended or adjusted under 35 U.S.C. 154(b) by 0 days.

(21) Appl. No.: 10/234,303

(22) Filed: Aug. 30, 2002

(65) Prior Publication Data

US 2003/0085422 A1    May 8, 2003

Related U.S. Application Data

(60) Provisional application No. 60/317,516, filed on Sep. 5, 2001.

(51) Int. Cl.
  *H01L 29/78*  (2006.01)
(52) U.S. Cl. .................. 257/333; 257/329; 257/330; 257/341; 257/342; 438/259; 438/589
(58) Field of Classification Search ............... 257/327, 257/329–331, 333, 341–342, 355, 412, E29.257
See application file for complete search history.

(56) References Cited

U.S. PATENT DOCUMENTS

| 4,767,722 | A | * | 8/1988 | Blanchard | 438/270 |
|---|---|---|---|---|---|
| 5,614,751 | A | * | 3/1997 | Yilmaz et al. | 257/394 |
| 5,744,386 | A | * | 4/1998 | Kenney | 438/245 |
| 5,910,669 | A | | 6/1999 | Chang et al. | 257/339 |
| 5,998,835 | A | * | 12/1999 | Furukawa et al. | 257/330 |
| 6,188,104 | B1 | * | 2/2001 | Choi et al. | 257/330 |
| 6,194,741 | B1 | | 2/2001 | Kinzer et al. | 257/77 |
| 6,236,099 | B1 | * | 5/2001 | Boden, Jr. | 257/495 |
| 6,351,018 | B1 | * | 2/2002 | Sapp | 257/499 |
| 6,413,822 | B1 | * | 7/2002 | Williams et al. | 438/270 |
| 6,437,386 | B1 | * | 8/2002 | Hurst et al. | 257/301 |
| 6,534,365 | B1 | * | 3/2003 | Kim et al. | 438/270 |
| 6,538,280 | B1 | * | 3/2003 | Nakamura | 257/333 |

FOREIGN PATENT DOCUMENTS

JP    11-031815    *  2/1999

OTHER PUBLICATIONS

S. Wolf et al, "Silicon Processing for the VLSI Era", vol. 1—Process Technology, Second Edition, Chapter 1, p. 1, Lattic Press, Sunset Beach, CA (2000); ISBN No.: 0-9616721-6-1.*

(Continued)

*Primary Examiner*—Nathan J. Flynn
*Assistant Examiner*—Johannes Mondt
(74) *Attorney, Agent, or Firm*—Ostrolenk, Faber, Gerb & Soffen, LLP (57) ABSTRACT

A trench type power MOSgated device has a plurality of spaced trenches lined with oxide and filled with conductive polysilicon. The tops of the polysilicon fillers are below the top silicon surface and are capped with a deposited oxide the top of which is flush with the top of the silicon. Source regions of short lateral extent extend into the trench walls to a depth below the top of the polysilicon. A trench termination is formed having an insulation oxide liner covered by a polysilicon layer, covered in turn by a deposited oxide.

4 Claims, 6 Drawing Sheets

OTHER PUBLICATIONS

S. Wolf et al, "Silicon Processing for the VLSI Era", vol. 1—Process Technology, First Edition, Chapoter 5, p. 124, Lattic Press, Sunset Beach, CA (1986), ISBN No.: 0-961672-3-7.*

B. Jayant Baliga, "Power Devices", Chapter 4 in "Modern Semiconductor Device Physics", Edited by S.M. Sze, John Wiley & Sons, Inc., New York (1998), ISBN No.: 0-471-15237-4, pp. 183-185, 211, 215 and 217.*

Wolf, S., "Silicon Processing for the VLSI Era", vol. 3—The submicron MOSFET, pp. 368-373 (ISBN: 0-961672-5-3), Lattice Press, Sunset Beach (CA) (1995).*

* cited by examiner

TRENCH FET WITH SELF ALIGNED SOURCE AND CONTACT

RELATED APPLICATION

This application claims the benefit of U.S. Provisional Application No. 60/317,516, filed Sep. 5, 2001.

FIELD OF THE INVENTION

This invention relates to power MOSFETs and more specifically relates to a novel structure and manufacturing process for low voltage trench type MOSFETs.

BACKGROUND OF THE INVENTION

Low voltage trench type MOSFETs are well known. In present day devices, the manufacture process is complicated due to the contact etch and the use of shallow implants. Thus, with regard to the contact etch, problems exist of an incomplete silicon etch and metal step coverage and incomplete filling of the trench. Further, shallow implants into deep contacts introduces defects which reduce the $BV_{dss}$ of the device.

Further, in low voltage trench MOSFETs, the on resistance ($R_{DSON}$) is highly dependent on the channel contribution, which is greater than 40% of the total $R_{DSON}$. Thus, an increase in channel density and a reduction in channel length is desirable to reduce $R_{DSON}$. However, increasing cell density produces complications in the design of the device and the manufacturing process.

Further, in the manufacturing process, each of the trenches are filled with a conductive polysilicon gate mass and capped with an oxide which insulates the source electrode from the polysilicon gate. This oxide is conventionally a grown oxide. It has been found that manufacturing problems occur as result of the grown oxide cap.

It would be desirable to reduce the manufacturing complexity and to also reduce the $R_{DSON}$ of trench type low voltage MOSFETs.

BRIEF DESCRIPTION OF THE INVENTION

In accordance with the invention a novel process and device structure is provided which employs:

a thickened bottom oxide in the trenches;

a simplified current flow path;

no source in the termination region;

no contact etch into the silicon (to eliminate a critical source alignment and metal step coverage problems).

a deposited oxide cap over the tops of the polysilicon gates in the trenches.

Further, in accordance with the invention and in the active area, the source/gate overlap is defined only by diffusions, and the gate oxide layers in the trenches are shielded from the polysilicon etch plasma and from source implant damage.

In accordance with a significant feature of the invention, the oxide used to cap the conductive polysilicon gates in the trenches is a deposited rather then a grown oxide.

The resulting structure has a reduced manufacturing complexity, a lower $R_{DSON}$; a smaller die size for the same current, and improved manufacturing yield.

DETAILED DESCRIPTION OF THE PREFERRED EMBODIMENTS

Figure 1:
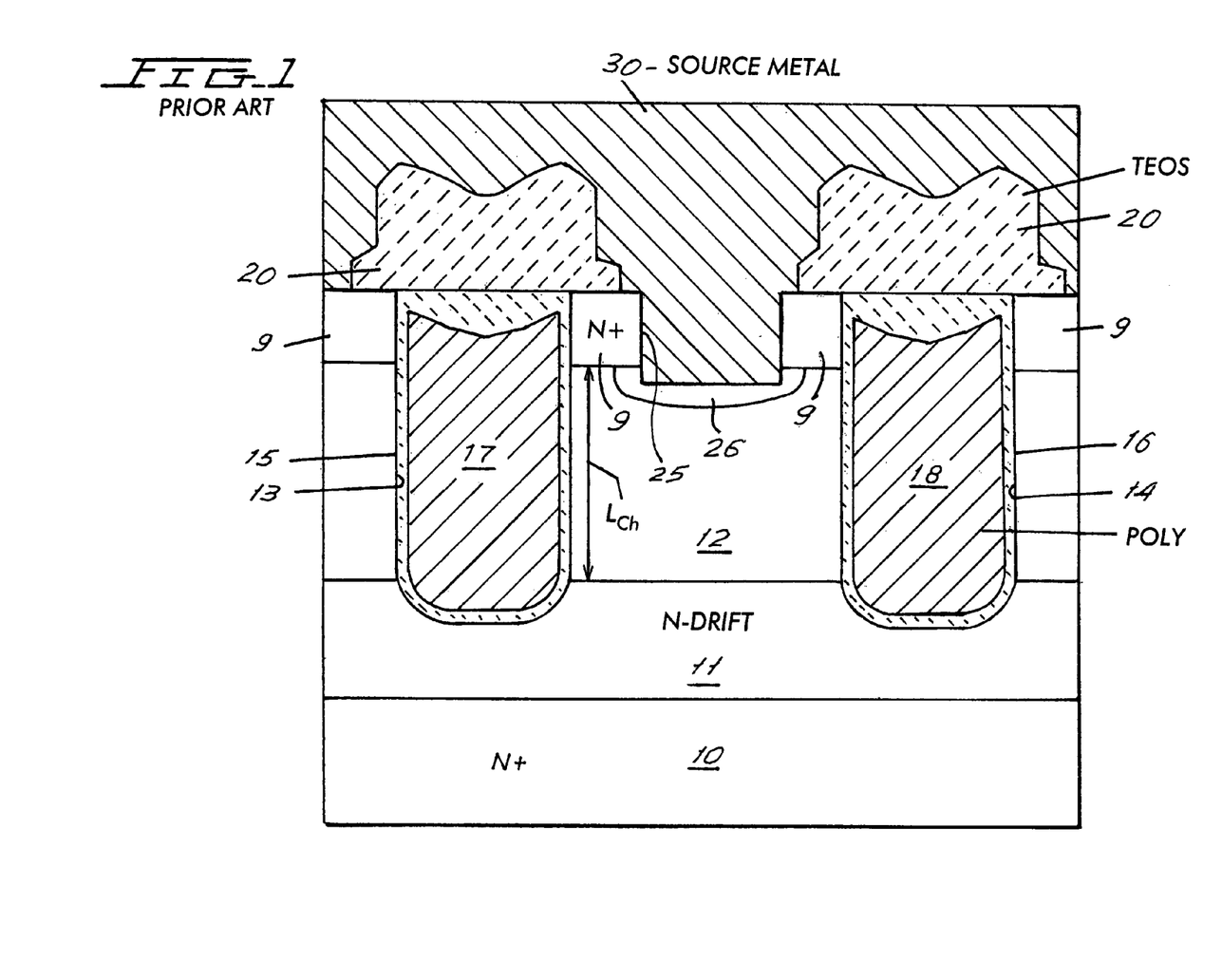
FIG. 1 is a cross-section of a small portion of the active area of a prior art device with a grown oxide capping the polysilicon gates.
Figure 2:
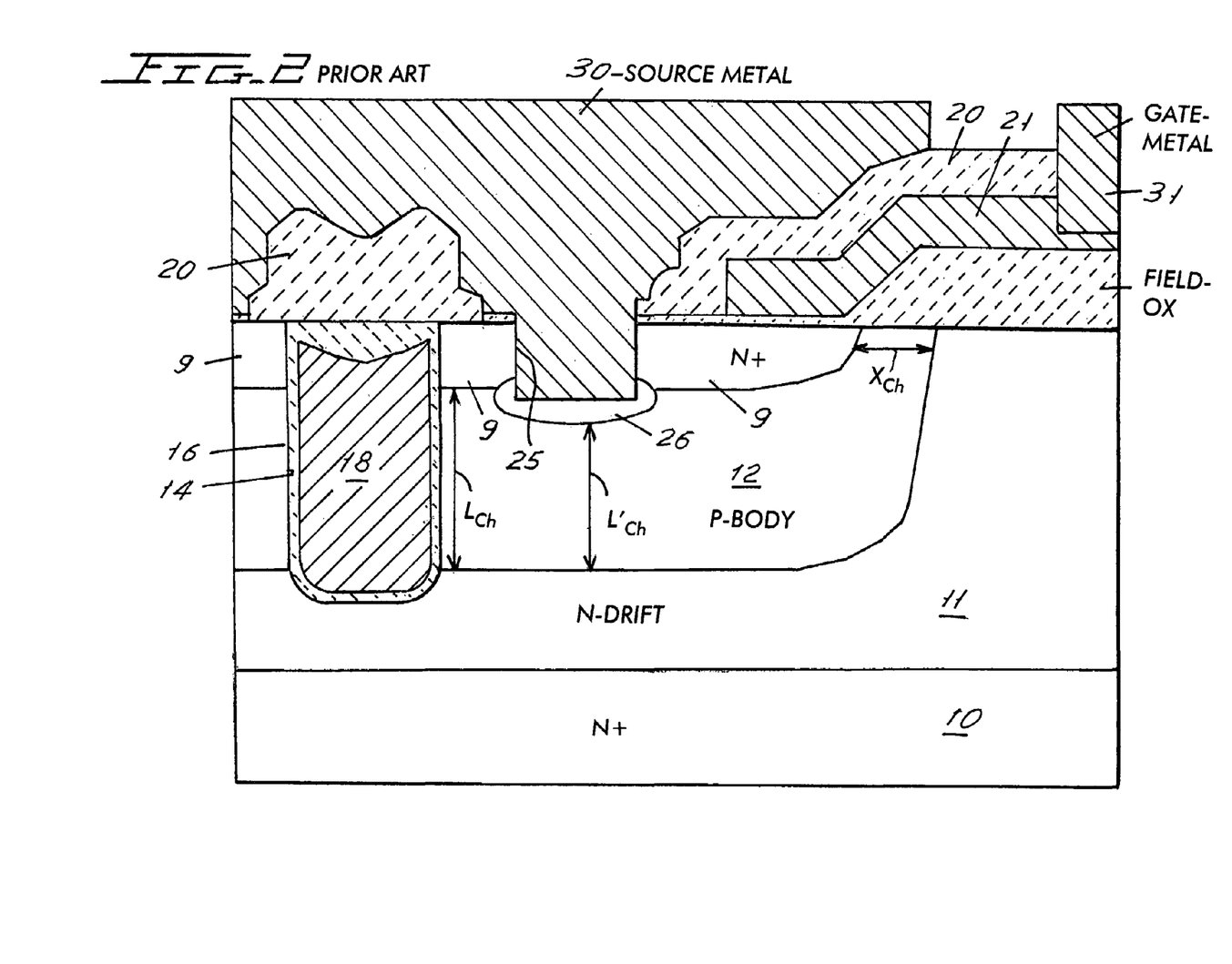
FIG. 2 is a cross-section of a small portion of the termination region of the prior art device of FIG. 1.

Referring first to FIGS. 1 and 2, there is shown a known trench MOSFET. Thus, there is shown an N$^+$ substrate 10. Substrate 10 contains a drain electrode on its bottom, not shown, and has an epitaxially grown N$^-$ drift layer 11 grown thereon.

A P type body diffusion 12 is formed in N$^-$ drift region 11, and an N$^+$ source layer 9 is diffused into region 12. Trenches 13, 14 are etched into the P body 12 and are lined with a gate oxide 15, 16 respectively and are filled with conductive polysilicon gates 17, 18 respectively. The tops of polysilicon regions 17, 18 were topped with thermally grown oxide caps and are covered by a TEOS insulation layer 20. A gate electrode 21 (FIG. 2) is connected to all polysilicon elements 17, 18 (connection not shown).

A contact trench 25 is formed as shown and a P$^+$ contact diffusion 26 is formed at the bottom of the trenches 25. Finally, a source metal 30 is deposited atop the wafer and is separated to also define a gate metal contact 31 (FIG. 2) which contacts gate electrode 21. The grown oxide cap atop polysilicon 17 and 18 insulated polysilicon 17 and 18 from source metal 30. This grown oxide cap has been a source of failure.

The structure shown provides a lateral channel of dimension $X_{ch}$; an effective channel of length $L^1_{ch}$; and channel of length $L_{ch}$ (FIG. 2).

In operation, the breakdown voltage of the device is limited by the lengths channels $X_{ch}$ and $L^1_{ch}$; by the contact etch; and by the need for the shallow N$^+$ and P$^+$ implants 25 and 26 respectively.

Further, the channel length $L_{ch}$ is appreciably greater than the maximum depletion width because of limitations imposed on the breakdown voltage BV by the contact manufacturing sequence. Contact alignment is a critical process parameter, and metal step coverage is a problem.

Figure 3:
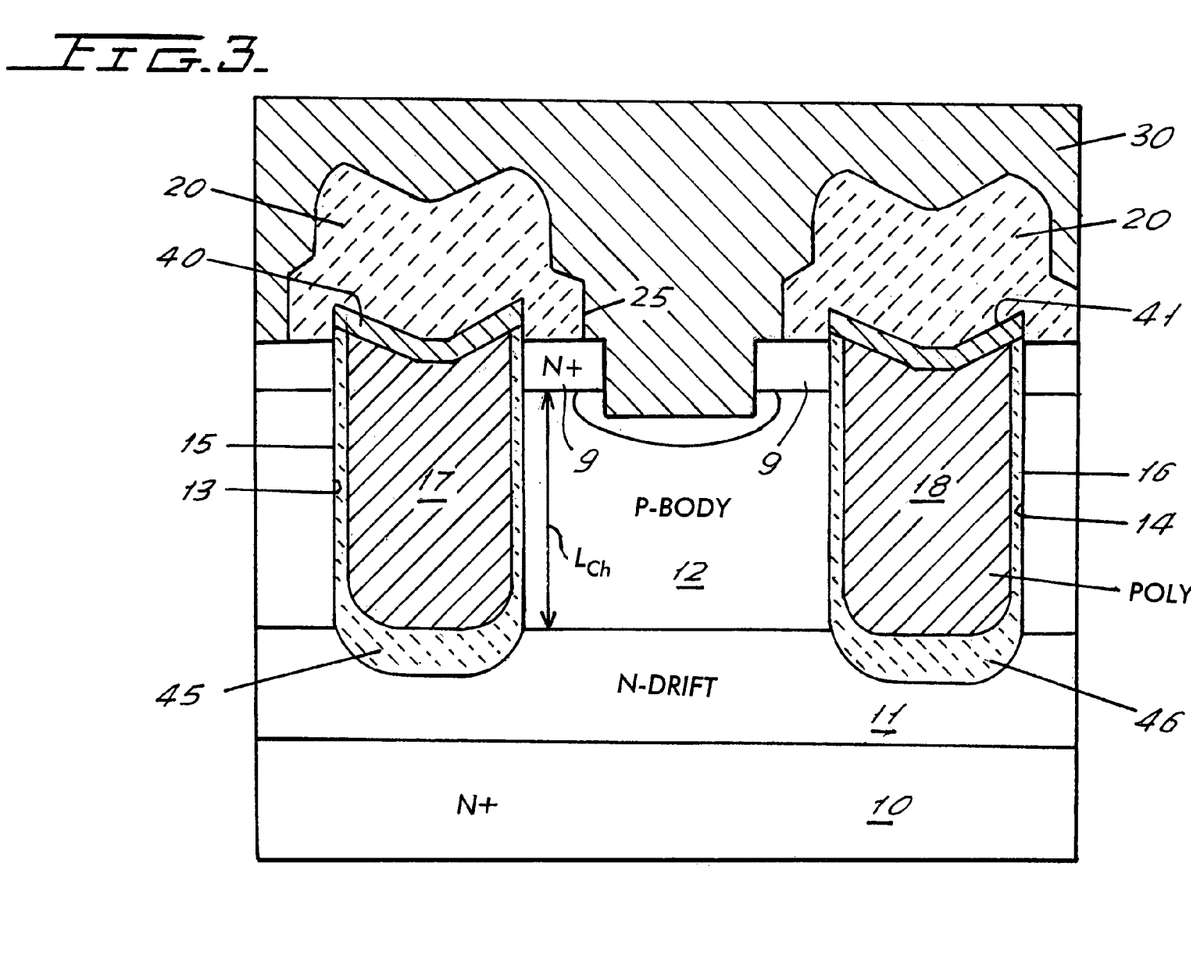
FIG. 3 is a cross-section of FIG. 1 with a suicide on the gate polysilicon.

FIG. 3 shows one improvement of the device of FIGS. 1 and 2 in which the top of the polysilicon trench fillers 17 and 18 are covered by metal silicide layers 40, 41 respectively which reduces the effective lateral gate resistance to a gate terminal. No other insulation is disposed between the oxide caps 20 and the metal silicide layers 40, 41, and the oxide caps 20 extend over the metal silicide layers 40, 41 and at least a portion of source layers 9. Further, the gate oxide 15, 16 is caused to be thickened at the bottoms 45 and 46 of trenches 13 and 14, respectively. Still further, in FIG. 3, a thicker hardmask is used, and the recess at the center of polysilicon fillers does not reach below the hard mask. Also, in FIG. 3, the source/gate overlap which determines the device $Q_g$ is defined only by diffusions. Each source layer 9 is overlapped entirely by a respective polysilicon gate electrode 17, 18. Finally, the gate oxide 15, 16 is shielded from the polysilicon etch plasma and from source implant plasma.

Figure 4:
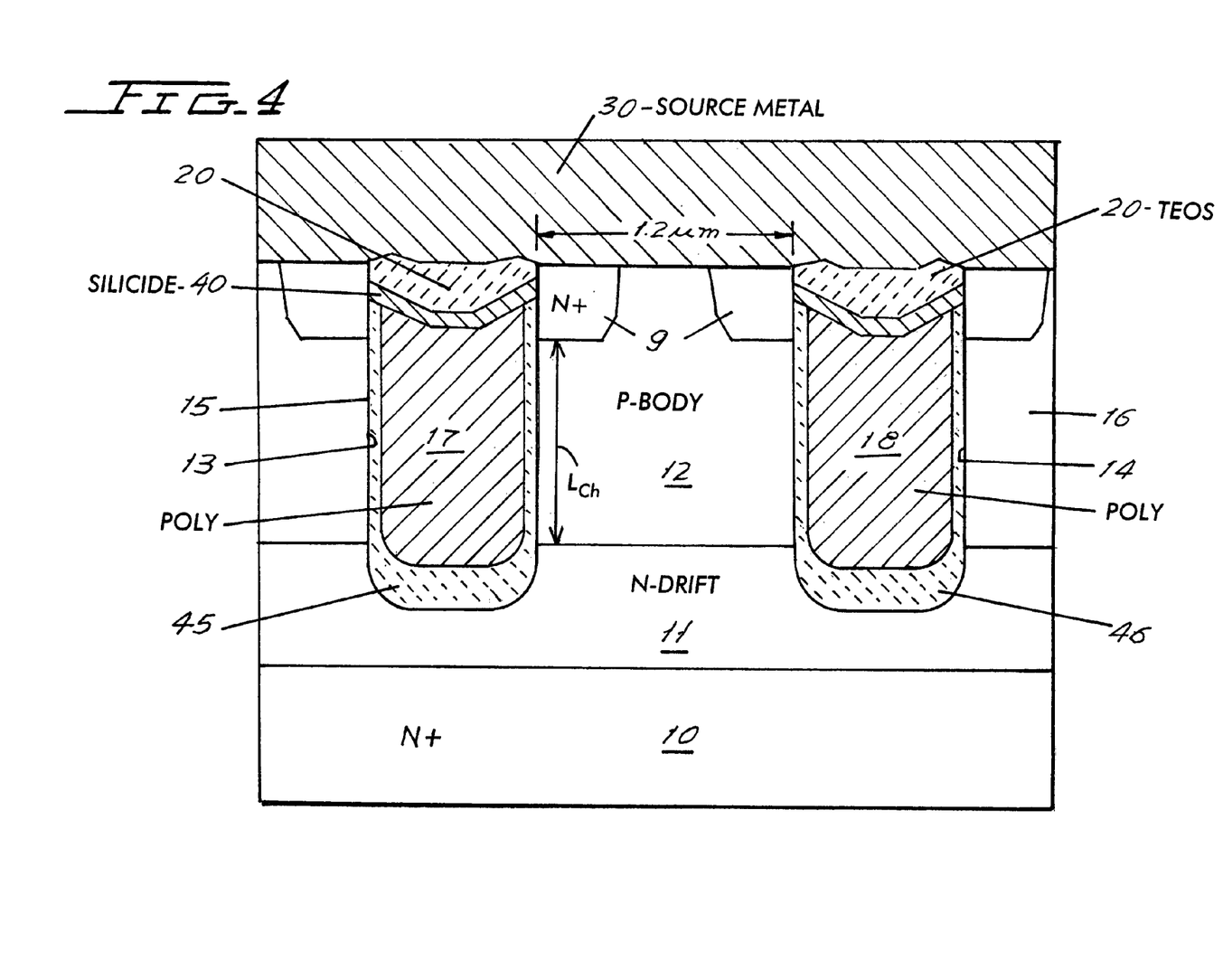
FIG. 4 is a cross-section like that of FIG. 1, with the features of the present invention including a deposited capping oxide on the polysilicon in the trenches.
Figure 5:
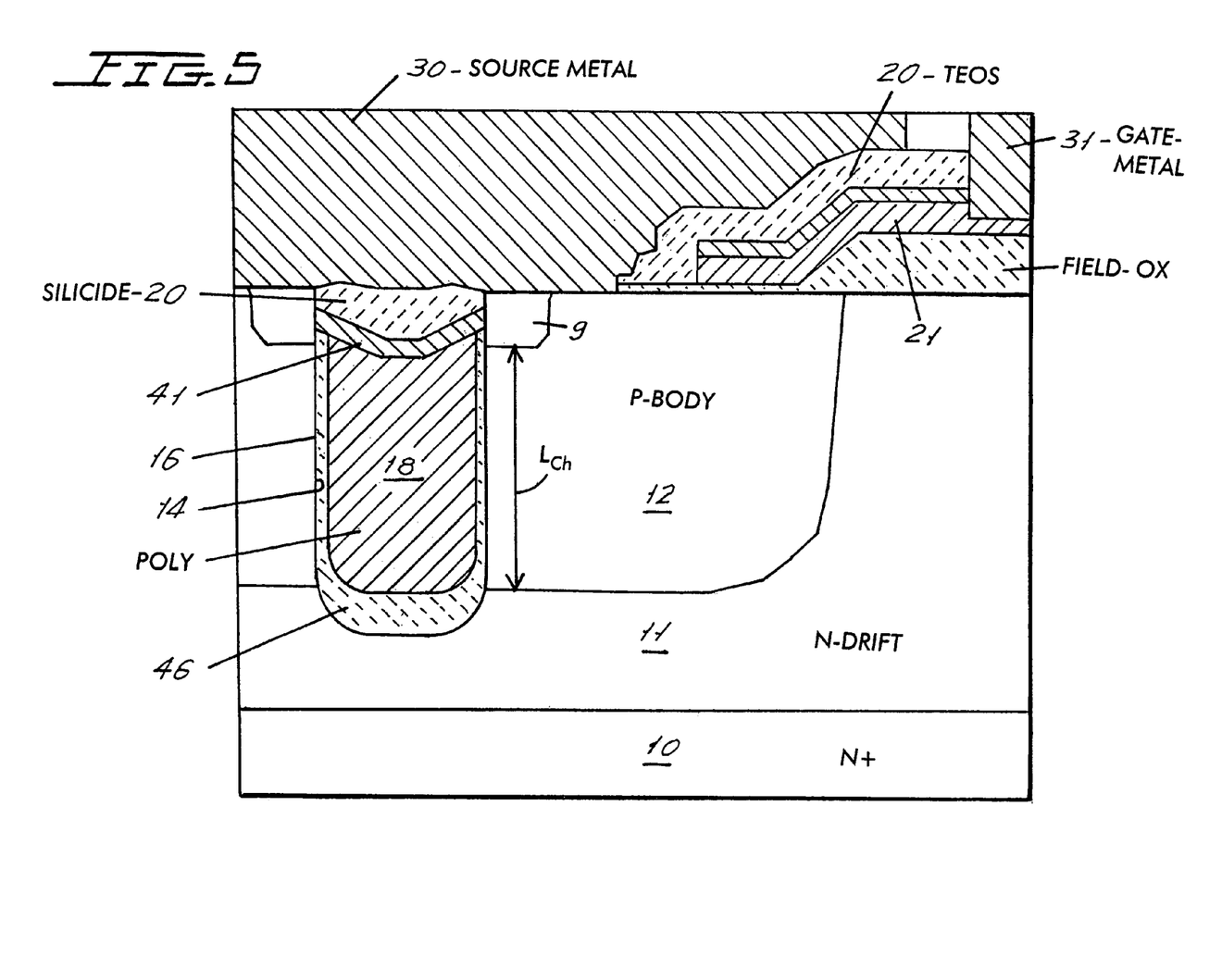
FIG. 5 is a cross-section of the termination region for the device of FIG. 4.

FIGS. 4 and 5 show the modified structure and process included in the present invention. It will be noted that the thickened bottom oxides 45 and 46 are used, as is the silicided gate elements 40 and 41 (which are eliminated in FIG. 6). Further, however, the source 9 does not extend into the termination (FIG. 5), and there is no contact etch into the silicon (avoiding critical source alignment and metal step coverage issues). Further, a simplified current flow path is provided.

Significantly, the oxide cap 20 above the polysilicon 17 and 18 (the silicide layer 40, 41 may be removed) is a deposited oxide, preferably LD TEOS having a thickness of 4000 Å and etched back to be approximately flush with the silicon surface. Again, no other insulation is disposed between the oxide cap 20 and the silicide layer 40, 41. The oxide cap 20 does not extend over the source 9.

One process which has been used to make a device of the present invention employed the following basic steps:

1. A pad oxide grown atop the surface of an N⁻ drift region (region 11 of FIGS. 4 and 5) of a semiconductor wafer or chip to a thickness of about 240 Å.

2. A P type channel implant is formed into the top of the N⁻ drift region 11.

3. Nitride is deposited atop the P type channel implant to a thickness of about 3500 Å.

4. An active mask is formed atop the device surface and a termination trench (not shown in FIGS. 1 to 5 but shown in FIG. 6) may be formed to a depth of 0.7 microns.

5. A channel drive, to drive the P implant is carried out at about 1100° C. for about 30 minutes forming P channel region 12.

6. A field oxidation step is carried out, forming an oxide to a thickness of about 5000 Å.

7. An active area trench mask is formed to etch trenches 17, 18 to a depth of 1.1 micron and a width of 0.4 micron. Other trench dimensions may be used.

8. A sacrificial oxide (450 Å) and etch is then carried out.

9. A pad oxide of 240 Å is then grown, followed by a gate nitride deposition over the walls of the trenches and over the top mesa surfaces between the walls.

10. A dry nitride etch then removes the nitride from the trench bottoms.

11. An oxide 45 is then grown in the trench bottoms to 2000 Å.

12. The nitride on the vertical trench walls is removed by a wet nitride etch.

13. The cleared trench walls then receive a grown gate oxide (15, 16).

14. Polysilicon is next deposited over the wafer and into the trenches to a thickness of 5000 Å.

15. A POCl deposition then takes place and is driven to make polysilicon masses 17 and 18 conductive.

16. The polysilicon is then etched, forming a recess below the silicon surface about 0.15 microns deep (±0.1 micron).

17. Next a polyoxide is formed to about 450 Å.

18. An oxide on nitride etch is then carried out, and nitride is pulled back laterally by about 1000 Å to clear the corners of the mesas between trenches for a source implant.

19. Following an AME oxide etch, an arsenic source implant is carried out, for forming the N⁺ source regions 9.

20. Thereafter, and in accordance with an important feature of the invention, a low density TEOS deposition is carried out to a thickness of about 4000 Å to form the oxide plugs 20 in FIGS. 4 and 5. It is significant that the oxide plugs are not grown, but are deposited, leading to a device of improved reliability.

21. Thereafter, there is a source drive with oxidation, followed by a contact mask. Note that the sources are of short lateral extent and extend deep into the trench and primarily along gate oxide, not cap oxide.

22. These steps are followed by an SP⁺ implant and drive.

23. Following a premetal clean step, there is an FM sputter, metal mask and aluminum etch.

24. Standard finishing steps are then used, followed by a back metal (not shown) formed on the bottom of the N⁺ wafer 10.

Figure 6:
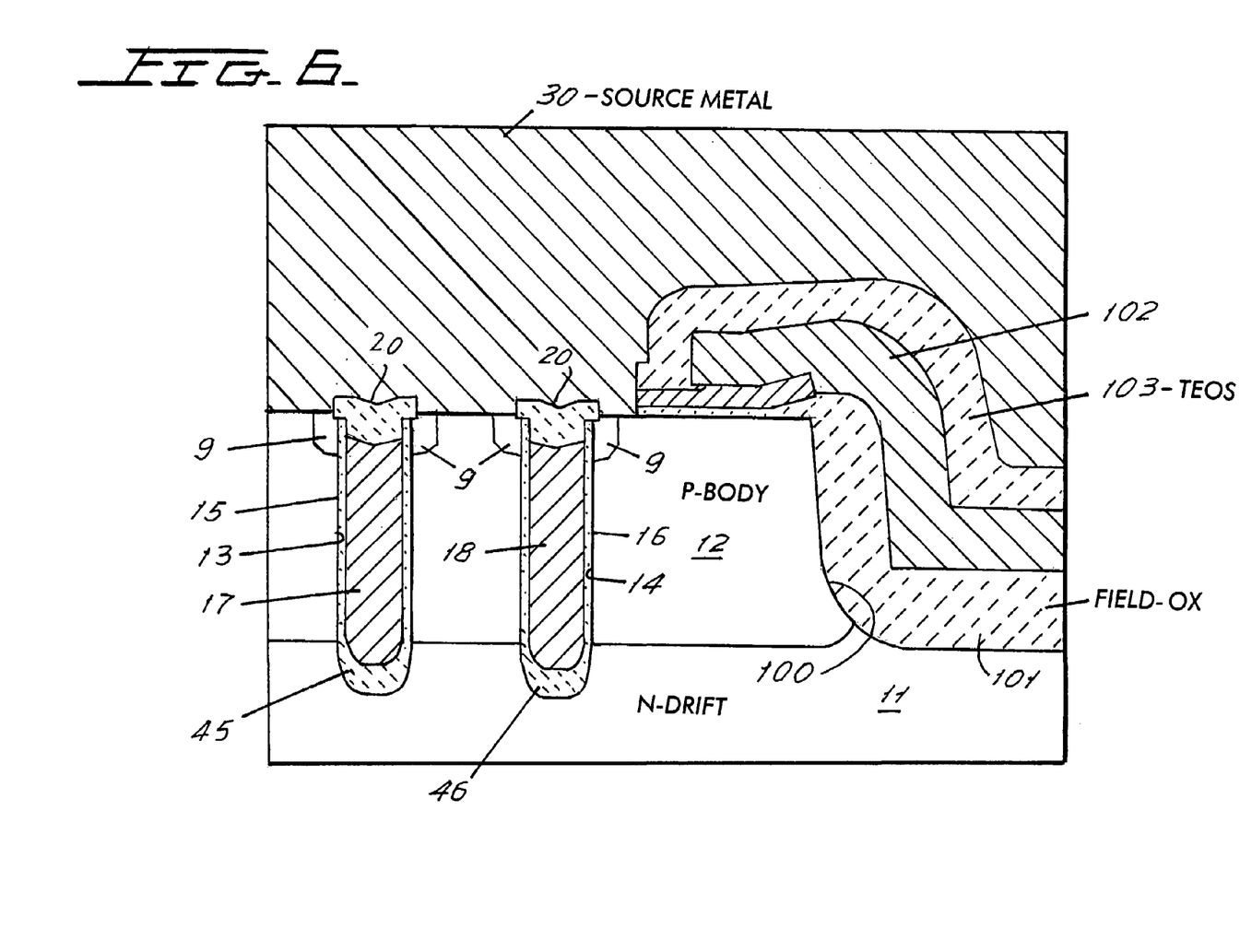
FIG. 6 is a cross-section of a modified termination structure for the device of FIG. 4.

FIG. 6 shows a modified termination (a trench termination) for the device of FIG. 4 and made by the foregoing process. In FIG. 6 components similar to those of FIG. 4 have the same identifying numeral.

It will be noted in FIG. 6 that the plugs 20 are clearly pulled back (steps 18 and 19) to provide a lateral source region contact surface to source metal 30. Further, the novel termination has a termination trench 100, formed at step 4 above, which is covered by field oxide 101, formed at step 7, a conductive polysilicon field plate 102, formed at steps 14 to 16, and the deposited TEOS layer 103 formed in step 20 above.

The novel structures of FIGS. 3, 4, 5 and 6 permits an increase in the trench cell density, and a reduction in channel length $L_{ch}$ for the same BV as compared to the prior art device of FIGS. 1 and 2 and a more compact channel structure.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. A power semiconductor device comprising:
    a semiconductor die, said semiconductor die including a drift region of a first conductivity type;
    a channel region of a second conductivity type over said drift region;
    a plurality of trenches extending to a depth below said channel region;
    gate insulation formed on sidewalls of each trench;
    a gate electrode disposed inside each trench;
    a silicide body formed over each gate electrode;
    an oxide plug comprised of TEOS formed over each silicide body;
    conductive regions of said first conductivity each formed adjacent a respective trench, each conductive region being overlapped entirely by a respective gate electrode; and a first contact formed over said die and in electrical contact with each one of said conductive regions of said first conductivity, wherein no other insulation is disposed between said oxide plug and said silicide body and said oxide plug extends over said suicide body and at least a portion of said each one of said conductive regions.

2. A power semiconductor device according to claim 1, further comprising a thickened oxide layer at the bottom of each trench.

3. A power semiconductor device according to claim 1, further comprising a substrate, said drift region being disposed over said substrate, and a second contact in electrical contact with said substrate.

4. A power semiconductor device according to claim 3, wherein said conductive regions are source regions, said first contact is a source contact and said second contact is a drain contact.

* * * * *